(12) United States Patent
Saeki (10) Patent No.: US 8,432,025 B2
(45) Date of Patent: Apr. 30, 2013

(54) SEMICONDUCTOR DEVICE AND PLURALITY OF DAMS

(75) Inventor: Yoshihiro Saeki, Tokyo (JP)

(73) Assignee: Lapis Semiconductor Co., Ltd., Yokohama-shi (JP)

(*) Notice: Subject to any disclaimer, the term of this patent is extended or adjusted under 35 U.S.C. 154(b) by 0 days.

(21) Appl. No.: 12/805,914

(22) Filed: Aug. 24, 2010

(65) Prior Publication Data

US 2010/0320581 A1 Dec. 23, 2010

Related U.S. Application Data

(63) Continuation of application No. 12/073,494, filed on Mar. 6, 2008, now Pat. No. 7,804,161.

(30) Foreign Application Priority Data

Mar. 30, 2007 (JP) .................... 2007-094715

(51) Int. Cl.
- *H01L 23/02* (2006.01)
- *H01L 23/495* (2006.01)
- *H01L 23/04* (2006.01)

(52) U.S. Cl.
USPC ...... 257/678; 257/667; 257/730; 257/E21.503

(58) Field of Classification Search .............. 257/667, 257/678, 730, E21.503
See application file for complete search history.

(56) References Cited

U.S. PATENT DOCUMENTS

| | | | |
|---|---|---|---|
| 5,202,577 A | 4/1993 | Ichigi et al. | |
| 5,311,060 A | 5/1994 | Rostoker et al. | |
| 5,953,589 A * | 9/1999 | Shim et al. | 438/106 |
| 6,291,264 B1* | 9/2001 | Tang et al. | 438/106 |
| 6,455,348 B1* | 9/2002 | Yamaguchi | 438/106 |
| 6,459,144 B1 | 10/2002 | Pu et al. | |
| 6,570,259 B2* | 5/2003 | Alcoe et al. | 257/778 |
| 6,750,533 B2 | 6/2004 | Wang et al. | |
| 6,809,406 B2 | 10/2004 | Yoshiike et al. | |
| 7,148,560 B2 | 12/2006 | Lee et al. | |
| 7,288,725 B2* | 10/2007 | Takeuchi et al. | 174/260 |
| 2003/0178709 A1 | 9/2003 | Andoh | |
| 2003/0193082 A1* | 10/2003 | Wang et al. | 257/667 |
| 2004/0212061 A1* | 10/2004 | Ochi et al. | 257/678 |
| 2006/0163749 A1* | 7/2006 | Lee et al. | 257/778 |
| 2006/0266545 A1* | 11/2006 | Takeuchi et al. | 174/251 |

FOREIGN PATENT DOCUMENTS

| | | | | |
|---|---|---|---|---|
| JP | 02058357 A | * | 2/1990 | |
| JP | 02130857 A | * | 5/1990 | |
| JP | 03019259 A | | 1/1991 | |
| JP | 03025965 A | | 2/1991 | |
| JP | 04146654 A | * | 5/1992 | |
| JP | 04164344 A | | 6/1992 | |
| JP | 04290252 A | | 10/1992 | |
| JP | 06169033 A | * | 6/1994 | |

(Continued)

*Primary Examiner* — Teresa M Arroyo (74) *Attorney, Agent, or Firm* — Rabin & Berdo, P.C.

(57) ABSTRACT

The invention provides a semiconductor device including a rectangular chip provided on a mounting region of a substrate, a liquid resin layer provided under the rectangular chip and on a side surface of the chip, and a plurality of dams formed on the substrate so as to extend along the side surface of the rectangular chip. The configuration allows the semiconductor device to be provided with the substrate having a reduced size which is achieved by preventing a liquid resin from flowing out.

9 Claims, 7 Drawing Sheets

FOREIGN PATENT DOCUMENTS

| | | |
|---|---|---|
| JP | 2004-179576 | 6/2004 |
| JP | 2005276879 | 10/2005 |
| JP | 2006-294986 | 10/2006 |
| WO | WO 2004114402 A1 * | 12/2004 |

* cited by examiner

SEMICONDUCTOR DEVICE AND PLURALITY OF DAMS

CROSS-REFERENCE TO RELATED APPLICATIONS

This is a continuation of parent application Ser. No. 12/073,494, filed Mar. 6, 2008 now U.S. Pat. No. 7,804,161, and allowed on May 26, 2010. The entire disclosure of the parent application is incorporated herein by reference. Furthermore, this application claims priority under 35 USC 119 of Japanese Patent Application No. 2007-094715, filed Mar. 30, 2007, the disclosure of which is incorporated by reference herein.

BACKGROUND OF THE INVENTION

1. Field of the Invention

The present invention relates to a semiconductor device and, more particularly, to a semiconductor device provided by mounting a semiconductor on a substrate in a flip-chip manner.

2. Description of the Related Art

Recently, there is a trend toward integration and mounting of electronic components in higher densities as a result of increasing demands for electronic device having more functions and smaller weights and sizes. Accordingly, MCM (multi-chip module) or SIP (system in package) type products provided using flip-chip mounting are becoming the main stream of semiconductor devices. Some semiconductor devices of those types employ a configuration in which a semiconductor chip is flip-chip-mounted on a mounting substrate called an interposer.

Figure 9A:
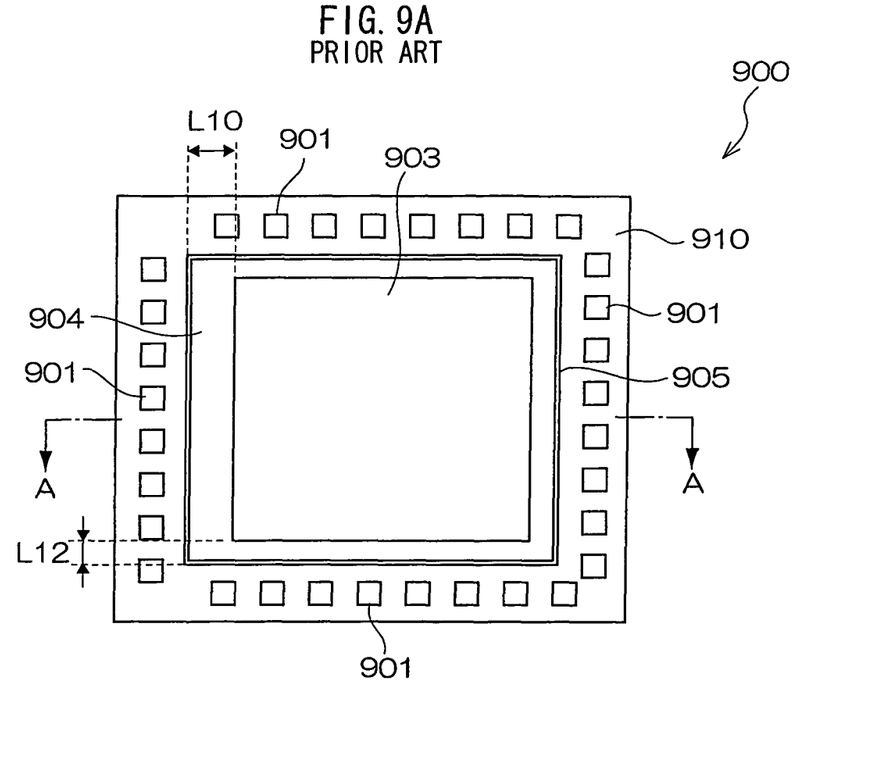
FIG. 9A is a plan view of a semiconductor device according to the related art.
Figure 9B:
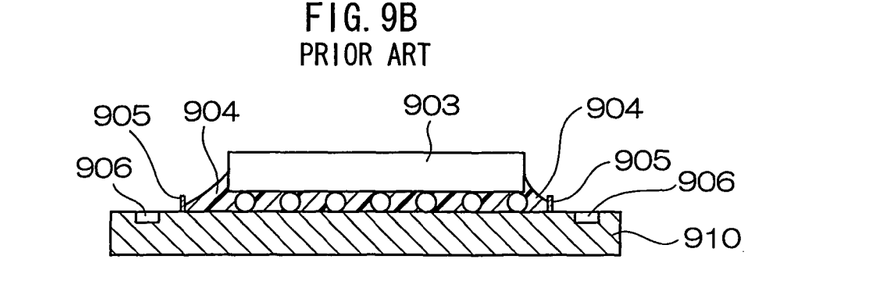
FIG. 9B is a sectional view taken along the line A-A in FIG. 9A showing the semiconductor device according to the related art.

FIGS. 9A and 9B show a configuration of a semiconductor device 900 according to the related art (see JP-A No. 2005-276879). FIG. 9A is a plan view of the device, and FIG. 9B is a sectional view of the same. The semiconductor device 900 illustrated includes a mounting substrate 910, a chip 903, a dam 905, a bump 901, and a liquid resin layer 904. Referring to the chip 903, a distance L10 between a predetermined edge of the region for mounting the chip and a part of the dam 905 associated with the predetermined edge is greater than a distance L12 between another edge of the chip mounting region and a part of the dam 905 associated with the other edge.

A liquid resin is dispensed to a region that is represented by the distance L10, and the resin is absorbed into a very small space between the chip 903 and the substrate 910 by capillarity to fill the space, whereby the liquid resin layer 904 is formed.

A liquid resin is dispensed to a region that is represented by the distance L10, and the resin is absorbed into a very small space between the chip 903 and the substrate 910 by capillarity to fill the space, whereby the liquid resin layer 904 is formed.

However, when the liquid resin is dispensed further so as to cover side surfaces of the chip after filling the very small space, the liquid resin may flow beyond the dam 905 to reach electrode pads 901 and to reach even side surfaces of the substrate.

In order to avoid the problem, the distances L10 and L12 must be made greater, and the external size of the mounting substrate 910 becomes greater accordingly.

When chips are provided in the form of a multiplicity of layers using flip chip mounting, a greater amount of liquid resin must be dispensed. Then, the external size of the mounting substrate 910 must be increased further to prevent the liquid resin from flowing out.

SUMMARY OF THE INVENTION

The invention was made to confront the above-described problem, and it is an object of the invention to provide a semiconductor device, a substrate of which can be made small by preventing a liquid resin from flowing out the same.

As a result of close studies, the inventor has found that the problem is solved in a semiconductor device as described below, and the above-described object has been thereby solved.

A first aspect of the present invention provides a semiconductor device comprising:

a substantially rectangular chip provided on a mounting region of a substrate;

a liquid resin layer provided under the rectangular chip and at a side surface of the chip; and a plurality of dams formed on the substrate so as to extend along the side surface of the rectangular chip.

In the semiconductor device in the first aspect of the invention, since the plurality of dams are formed, the liquid resin will not flow out the substrate even when the liquid resin is dispensed in an increased amount, which allows the substrate to be provided with a small size.

In a second aspect of the present invention, the plurality of dams may be provided in a region having a distance between a predetermined edge of the rectangular chip and an end of the substrate associated with the predetermined edge which is greater than a distance between another edge of the rectangular chip and an end of the substrate associated with the other edge.

In addition to the advantage of the first aspect of the invention, the semiconductor device in the second aspect of the invention is advantageous in that a sufficient liquid resin layer can be formed even when a plurality of chips having a rectangular shape in plan view (hereinafter "rectangular chip") are stacked because a region where an underfill material is to be dispensed is provided with a large area.

In a third aspect of the present invention, each of the plurality of dams may be disposed such that a recessed part of the same faces the chip.

In a fourth aspect of the present invention, each of the plurality of dams may have a linear shape.

In a ninth aspect of the present invention, wherein a plurality of the chips may be mounted on the substrate In addition to the advantages of the first and second aspects of the invention, the semiconductor devices in the third, fourth, and ninth aspects of the invention have the following advantages. A liquid resin can be prevented from flowing out even when the liquid resin is dispensed in an increased amount because surface tension is generated at the recessed parts of the plurality of dams to cause the liquid resin to bulge upward. Even when chips are provided in the form of a plurality of layers, a gap (space) between the chip in the top layer and the chip directly below the same can be filled with a liquid resin. Further, it is possible to prevent the generation of any void in a liquid resin between a part of the resin that is absorbed into a gap between a chip and a substrate by capillarity and a part of the resin attracted by the periphery of the chip. Further, even when chips are provided in the form of a plurality of layers, a gap between the chip in the top layer and the chip directly below the same can be filled with a liquid resin.

In a fifth aspect of the present invention, the interval between the chip and the dam adjacent to the chip may be in a range from 400% to 44000% of the width of the dams.

In a sixth aspect of the present invention, the pitch of the dams is in a range from 150% to 500% of the width of the dams.

In addition to the advantages of the first through fourth aspects and the ninth aspect of the invention, the semiconductor devices in the fifth and sixth aspects of the invention are advantageous in that a location to dispense a liquid resin can be easily set and in that a liquid resin can be uniformly spread throughout a chip mounting region to prevent the resin from flowing out the region.

In a seventh aspect of the present invention, the length of a straight line connecting ends of each of the plurality of dams may be equal to or less than the length of the edge of the chip associated with the dam.

In addition to the advantages of the first through sixth aspects and the ninth aspect of the invention, the semiconductor device in the seventh aspect of the invention is advantageous in that the size of the substrate can be made small because the area occupied by the dams can be minimized.

In a eighth aspect of the present invention, one or more dams may be also provided between the other edge of the chip and the end of the substrate associated with the other edge.

In addition to the advantages of the first through seventh aspects and the ninth aspect of the invention, the semiconductor device in the eighth aspect of the invention is advantageous in that a liquid resin absorbed into a gap between a pad and a substrate by capillarity can be prevented from spreading in regions different from the region where the liquid resin is dispensed.

The present invention makes it possible to provide a semiconductor device, a substrate of which can be made small by preventing a liquid resin from flowing out the substrate.

BRIEF DESCRIPTION OF THE DRAWINGS

Preferred exemplary embodiments of the invention will be described in detail based on the following figures, wherein.

DETAILED DESCRIPTION OF THE INVENTION

Best modes of a semiconductor device according to the invention will now be described with reference to the drawings. The description will include partial omissions to avoid duplicated statements.

<Semiconductor Device>

Semiconductor devices according to the invention include a rectangular chip provided in a mounting region on a substrate, a liquid resin layer provided under the rectangular chip and on side surfaces of the chip, and a plurality of dams formed on the substrate so as to extend along the side surfaces of the rectangular chip.

In a preferable mode of such semiconductor devices, the plurality of dams are provided in a region where the distance between a predetermined edge of the rectangular chip and an end of the substrate associated with the predetermined edge is greater than the distance between another edge of the rectangular chip and an end of the substrate associated with the other edge.

Figure 1A:
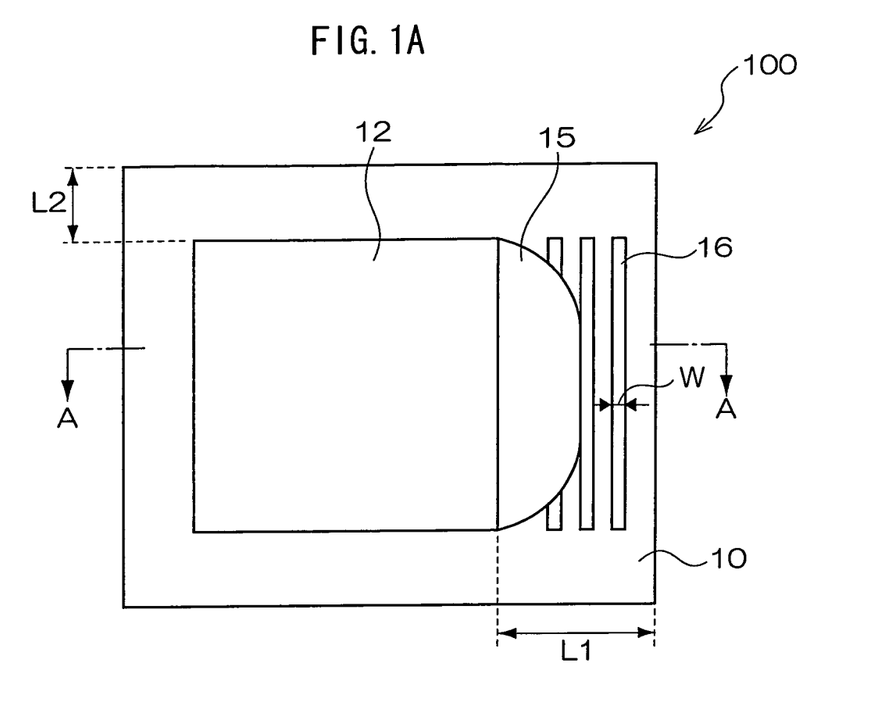
FIG. 1A is a plan view of a semiconductor device according to an embodiment of the invention.

For example, the description "the distance between a predetermined edge of the rectangular chip and an end of the substrate associated with the predetermined edge" means a distance L1 in FIG. 1A. Specifically, the description means the distance between any one of edges of a rectangular chip and an edge of a substrate having a rectangular plan shape associated with the one edge of the chip in FIG. 1A.

For example, the description "the distance between another edge of the rectangular chip and an end of the substrate associated with the other edge" means a distance L2 in FIG. 1A. Specifically, the description means the distance between an edge of the rectangular chip different from the one edge mentioned above and an edge of the substrate having a rectangular plan shape associated with the different edge in FIG. 1A.

The description "a region where the distance between a predetermined edge of the rectangular chip and an end of the substrate associated with the predetermined edge is greater than the distance between another edge of the rectangular chip and an end of the substrate associated with the other edge" means the region indicated by L1 in FIG. 1A.

A position to dispense a liquid resin can be easily set by providing such a region, and leakage of the liquid resin can be prevented when it is dispensed.

Figure 8:
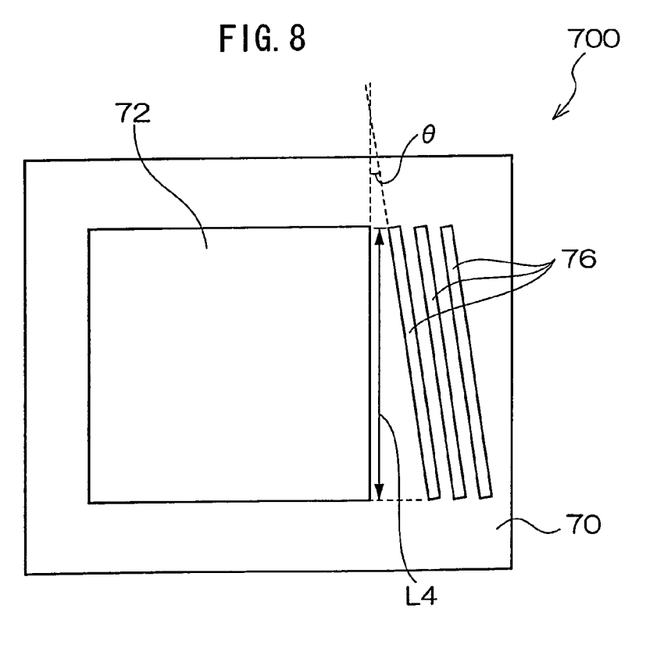
FIG. 8 is a plan view of a semiconductor device according to still another embodiment of the invention.

The description "a plurality of dams formed on the substrate so as to extend along the side surfaces of the rectangular chip" means a plurality of dams formed as shown in FIG. 8 in which dams 76 are formed such that a straight line connecting one end and another end thereof is in parallel with an edge of a chip 72 having a rectangular plan shape adjacent to the straight line or such that imaginary lines extended from the straight line and the edge of the chip cross at an angle θ in the range from 0° to 45°.

The plurality of dams and the chip which are constituent parts of the invention will now be described in detail.

[Plural Dams]

Figure 1B:
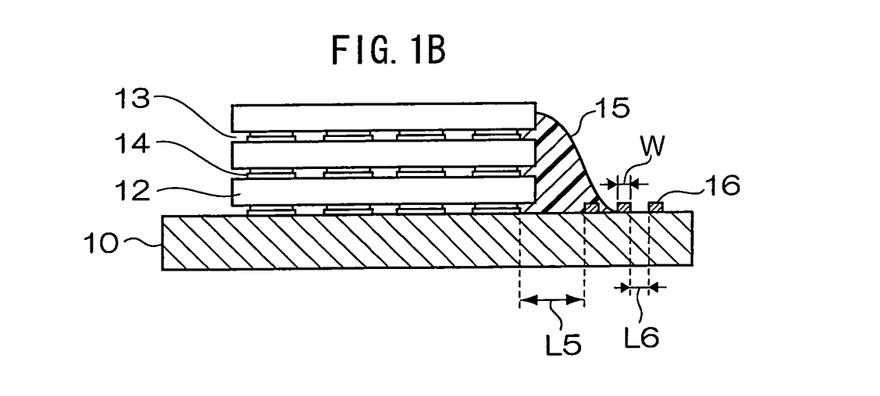
FIG. 1B is a sectional view taken along the line A-A in FIG. 1A showing the semiconductor device according to the preferred embodiment of the invention.

A semiconductor device according to the invention includes a plurality of dams. When a plurality of dams is provided, a liquid resin is prevented from flowing out from the periphery of the substrate by the plurality of dams even when the amount of the liquid resin dispensed is increased. Further, even when chips are provided in the form of a plurality of layers as shown in FIG. 1B, the surface tension of the liquid resin allows a gap 13 between the chips constituting the two uppermost layers to be filled with the liquid resin, which is preferable in that a liquid resin layer 15 can be formed.

A detailed description will now be made on the shape, length, and height of the plurality of dams, the distance between a chip and a dam adjacent to the same, the pitch of the plurality of dams, and the material of the dams.
(Shape of Dams)

Figure 2A:
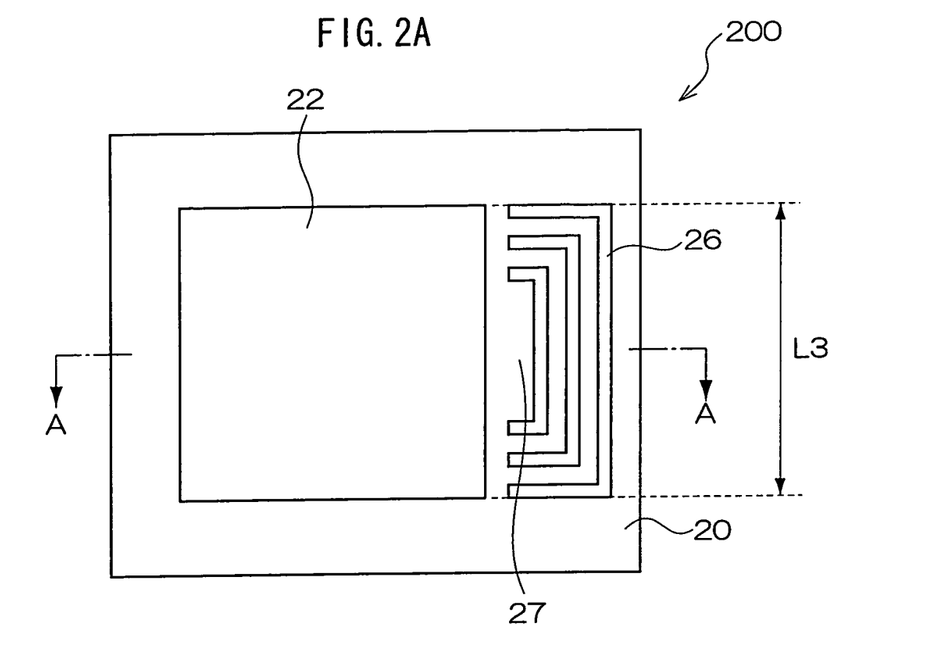
FIG. 2A is a plan view of the semiconductor device according to the embodiment of the invention.

Referring to the shape of the plurality of dams, as shown in FIG. 2A, each of the dams is preferably disposed such that a recessed part 27 thereof faces a chip, each of the dams preferably has a linear shape, and the dams are nested together.

Figure 3A:
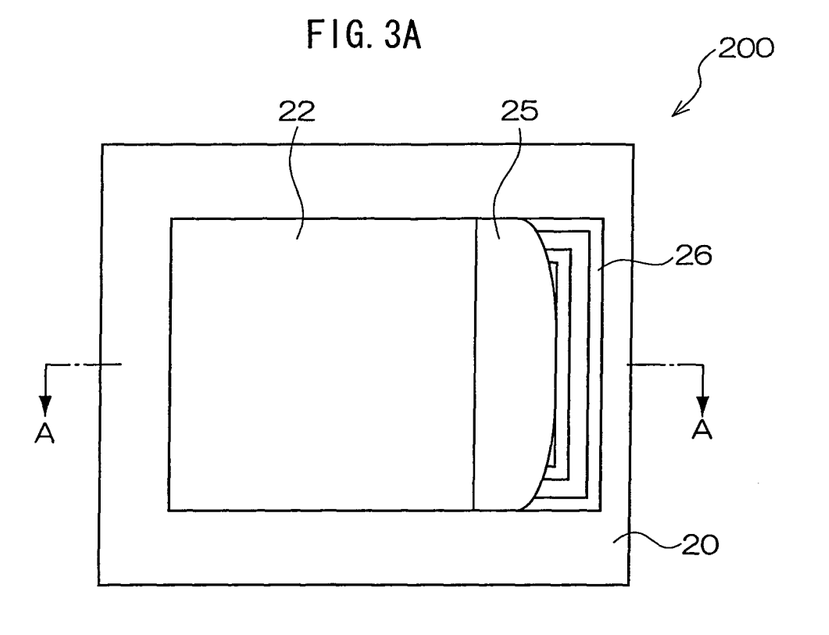
FIG. 3A is a plan view of the semiconductor device according to the embodiment of the invention showing a liquid resin dispensed thereon.
Figure 3B:
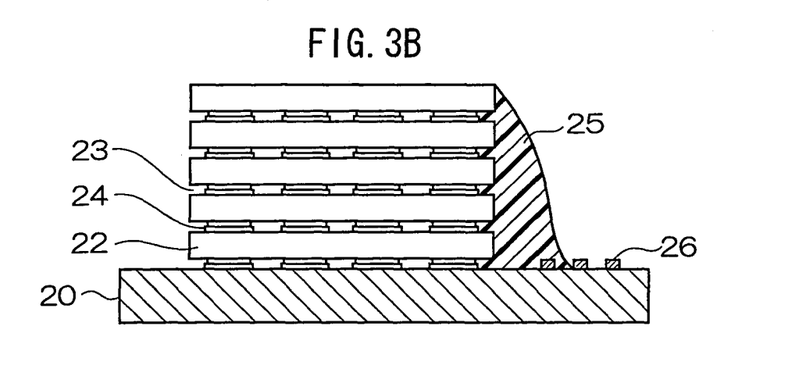
FIG. 3B is a sectional view taken along the line A-A in FIG. 3A showing the semiconductor device according to the embodiment of the invention with a liquid resin dispensed thereon.
Figure 4:
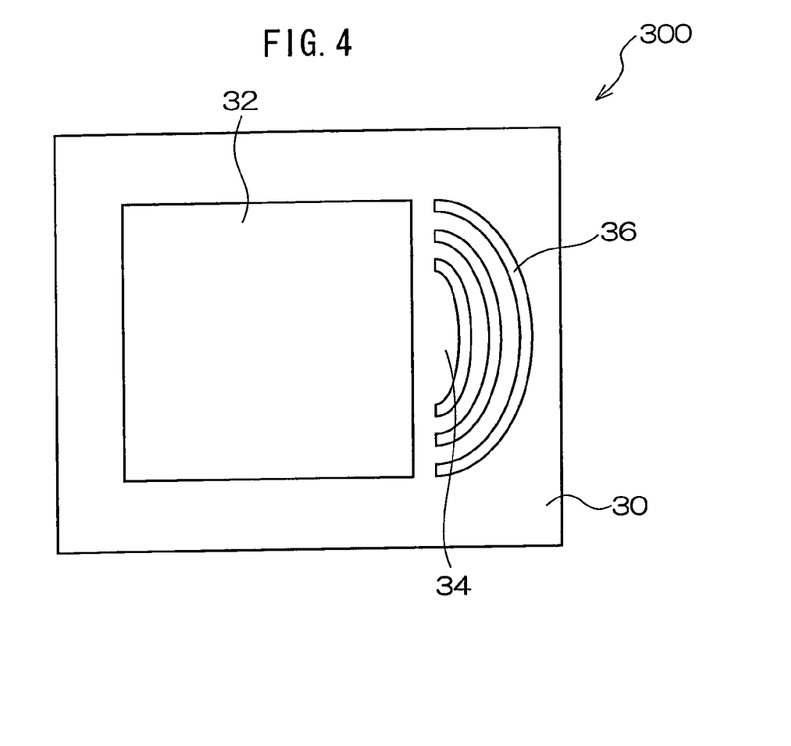
FIG. 4 is a plan view of a semiconductor device according to another embodiment of the invention.
Figure 5:
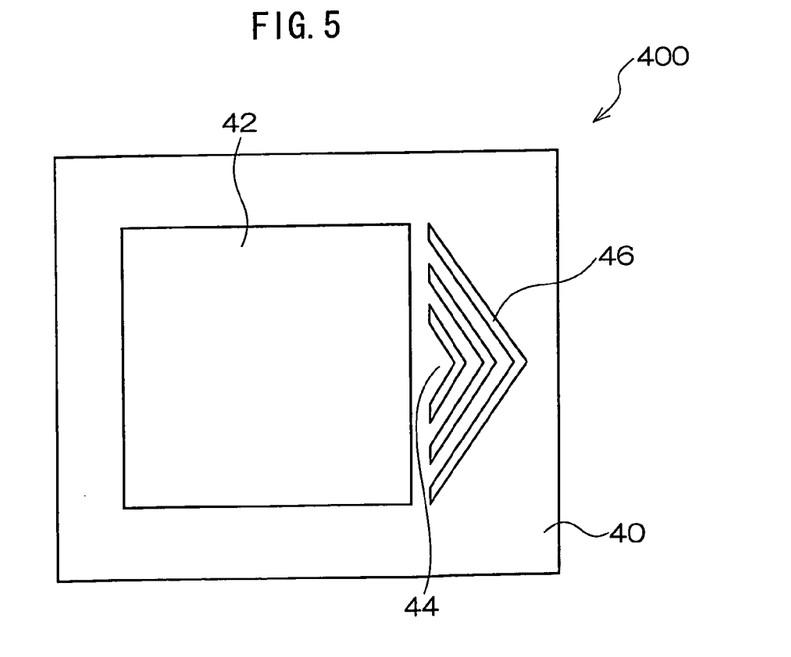
FIG. 5 is a plan view of a semiconductor device according to still another embodiment of the invention.

For example, the shape having a recessed part 27 may be a U-like shape as shown in FIG. 2A, an arcuate shape as shown in FIG. 4, or a triangular shape as shown in FIG. 5. Since the dams are disposed such that the recessed parts 27 face a chip, when a liquid resin is dispensed to the recessed parts 27, the liquid resin bulges upward in the direction of the height of the dams because of surface tension. As a result, even when chips are provided in the form of a plurality of layers, the liquid resin reaches the top layer as shown in FIG. 3B, which is preferable in that a liquid resin layer 25 can be formed.
(Length of Dams)

The plurality of dams is characterized in that the length of a straight line connecting ends of each dam is equal to or smaller than the length of an edge of a chip associated with the dam.

For example, when dams 26 are U-shaped as shown in FIG. 2A, a preferable mode for implementing the dams is to make a length L3 of a straight line connecting two ends of the dam 26 closest to an end of the substrate greater than the length of an edge of a chip 22 associated with the dam 26. Referring to FIG. 2A, the ends of the dam 26 are corners of the dam located on the side of the inner circumference thereof.

When the plurality of dams 76 is not parallel to an edge of a chip 72 adjacent to the dams 76 as shown in FIG. 8, the length of the dams 76 is represented by L4 which is given by $\cos \theta$ and the actual length of the dams 76.
(Height of Dams)

The height of a dam is defined such that leakage of a liquid resin will be prevented. Specifically, a dam has a height of 3 μm or more when the height of a top surface of a chip above a bottom surface of the substrate is 560 μm.

When there is a plurality of dams, the dams may have heights increasing toward a chip, and the dams may alternatively have heights decreasing toward the chip. Further, the plurality of dams may have the same height. From the viewpoint of ease of manufacture, it is preferable that the plurality of dams have the same height.
(Width of Dams)

Referring to FIGS. 1A and 1B, a minimum value of a width W of the dams 16 is defined in consideration to the strength of bonding between the dam and the substrate. In particular, the width is preferably equal to the interval between the dams 16 which will be described later.
(Distance Between Chip and Dam Adjacent to the Chip and the Pitch of a Plurality of Dams)

In a semiconductor device according to the invention, the interval between a chip and a dam adjacent to the chip is preferably in the range from 400% to 44000% of the width of the dam.

The pitch of a plurality of dams is preferably in the range from 150% to 500% of the width of the dams.

Referring to FIG. 1B, an interval L5 between the chip 12 and the dam 16 adjacent to the chip 12 is preferably in the range from 400% to 44000% of the width W of the dam 16 in order to allow a liquid resin to be dispensed such that droplets of the liquid will not contact the chip 12.

The pitch (represented by L6) between the plurality of dams 16 is in the range from 150% to 500% of the width W of the dams 16 from the viewpoint of the capillarity. More preferably, the pitch is 200% of the width.
(Position of Dams)

Figure 6A:
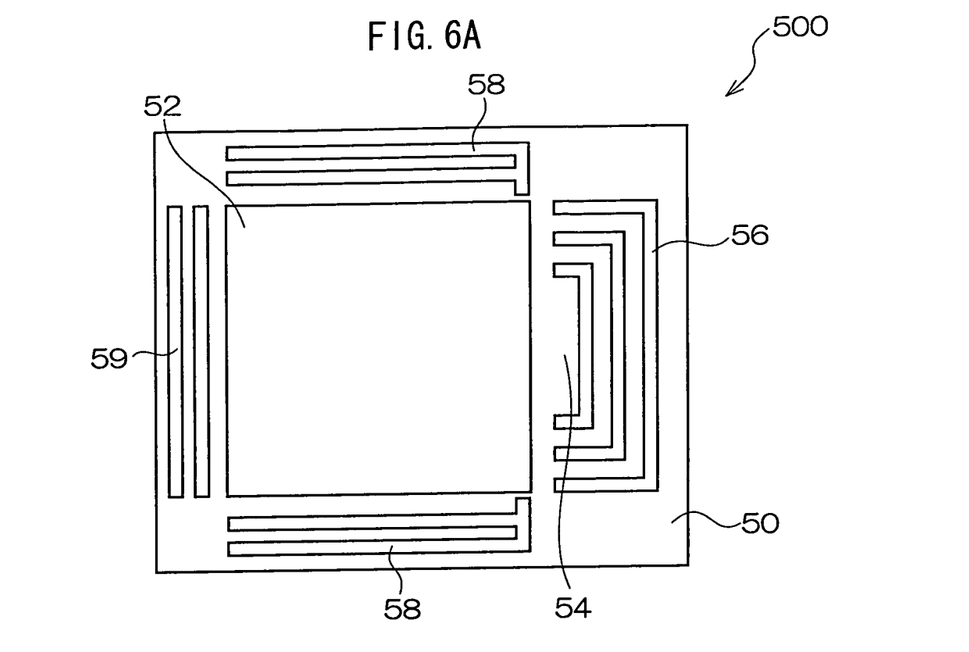
FIG. 6A is a plan view of a semiconductor device according to still another embodiment of the invention.

Referring to the position to dispose dams, dams may be formed in a region represented as having a length L1 between a predetermined edge of a chip (hereinafter referred to as "supplying edge" where appropriate) and an end of the substrate 10 associated with the predetermined edge as shown in FIG. 1. Then, a liquid resin is supplied to the region. In a preferable mode of a semiconductor device according to the invention as shown in FIG. 6, one or more dams (hereinafter referred to as "first auxiliary dam(s)" where appropriate) is provided between an edge of a chip other than a predetermined edge as described above and an end of a substrate 50 associated with the other edge. Referring to the position to dispose dams in this case, one or more dams 59 is formed along an edge of the chip opposite to the supplying edge. Alternatively, one or more dams 58 is formed along edges of the chip orthogonal to the supplying edge. In a more preferable mode, one or more dams 58 and 59 is formed along the edge opposite to the supplying edge and the edges orthogonal to the supply edge. The first auxiliary dams 58 and 59 may have a linear shape, and the dams may alternatively have a shape including a recessed part 54. When the dams have a recessed part 54, the recessed part 54 is preferably formed to face a chip 52.

Figure 6B:
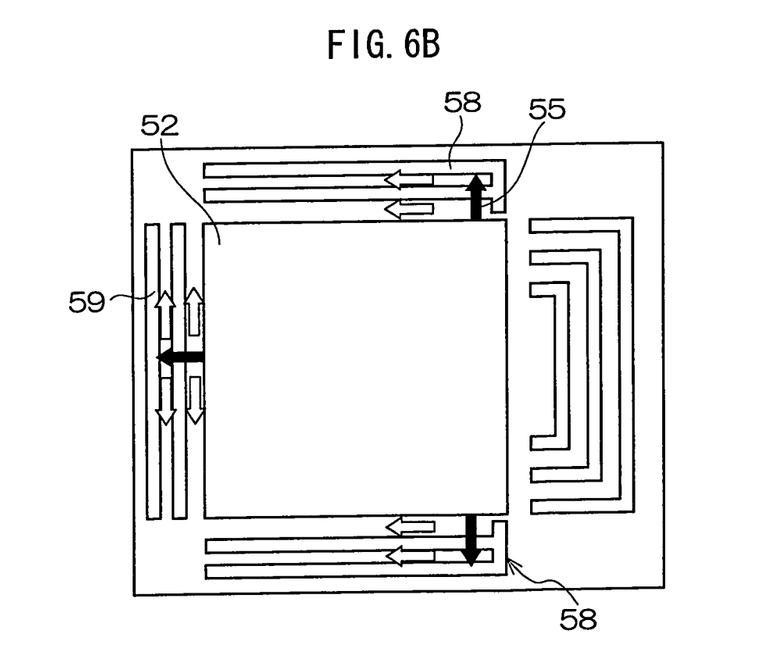
FIG. 6B shows directions in which a liquid resin flows.

Thus, after a liquid resin absorbed into the gap between the chip 52 and the substrate 50 flows out from the gap under the chip 52, the periphery of the chip 52 will be more easily covered by the liquid resin. Specifically, a liquid resin 55 which has flowed out from the gap under the chip 52 spreads along the dams 58 to cover the periphery of the chip 52 a shown in FIG. 6B, which allows a liquid resin layer to be formed.

Figure 7:
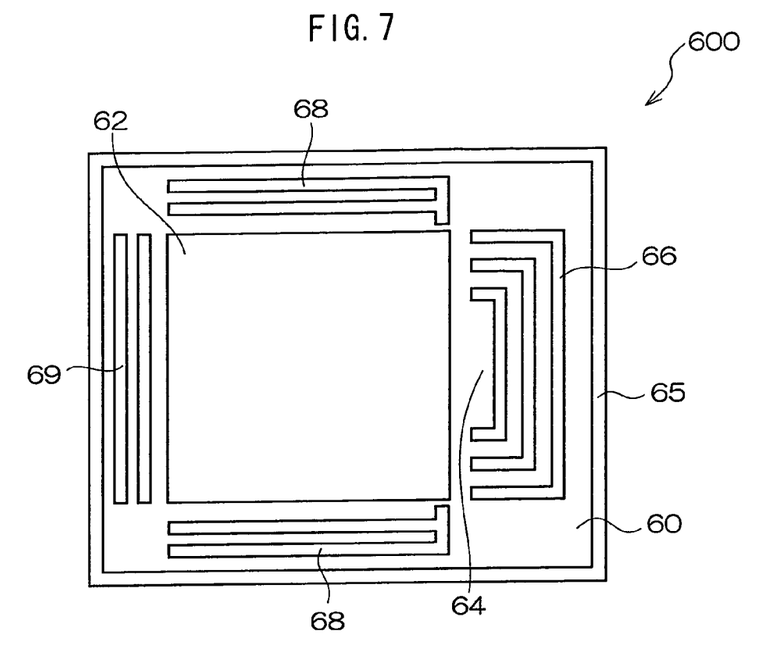
FIG. 7 is a plan view of a semiconductor device according to still another embodiment of the invention.

In an especially preferred mode, a dam 65 (hereinafter referred to as "second auxiliary dam" where appropriate) is further provided to cover the periphery of a substrate 60 as shown in FIG. 7. Thus, even when a liquid resin flows beyond all of dams 66, 68, and 69 formed on the substrate 60, the liquid resin can be prevented from flowing on to side surfaces of the substrate 60 because the second auxiliary dam 65 is provided on the sides of the substrate 60.

The height and width of the first and second auxiliary dams are the same as those described above.
(Material of Dams)

For ease of manufacture, the dams may be made of organic materials such as polyimide and solder resist, inorganic materials such as $SiO_2$ and SiN, and metal materials such as Cu, Al, Ni, and Au. Above all, polyimide is preferred.
[Chip]

Figure 2B:
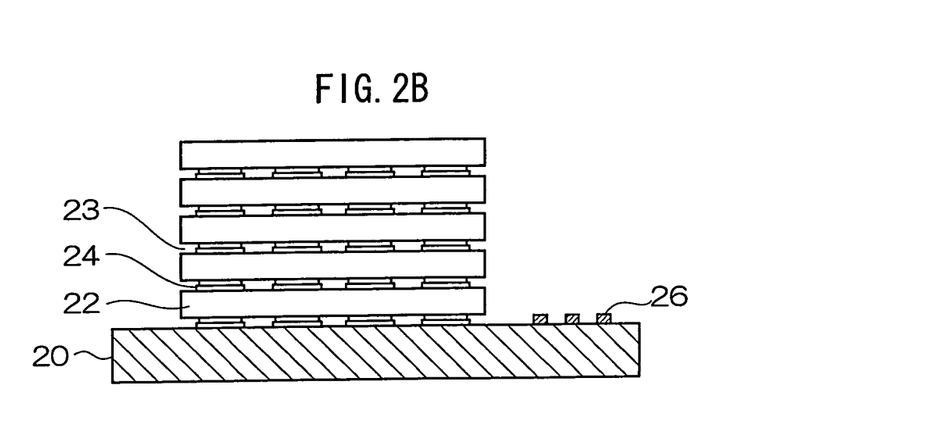
FIG. 2B is a sectional view taken along the line A-A in FIG. 2A showing the semiconductor device according to the embodiment of the invention.

A semiconductor device according to the invention includes a chip 12 having wirings and bumps formed thereon. The chip 12 is preferably flip-chip-mounted to manufacture the semiconductor device with a small size and a higher component density. As shown in FIGS. 1B and 2B by way of example, flip-chip mounting is a mounting method in which protruding electrodes (hereinafter referred to as "bumps" where appropriate) formed on a surface of a chip are mounted so as to face downward to allow direct electric connection.

The gap between the substrate 10 and the lowermost chip 12, and the gaps 13 between the chips 12 are preferably gaps such that a liquid resin is absorbed into the same by capillarity, and the gaps preferably have a size in the range from 10 μm to 30 μm.

A chip may be mounted on a substrate, a circuit substrate, or a semiconductor element. For example, a configuration may be employed, in which pads provided on such a substrate and pads on a chip are electrically connected.

<Method of Manufacturing Semiconductor Device>

For example, a semiconductor device according to the invention may be manufactured as follows. Steps of manufacturing the device shown in FIG. 7 will be schematically described by way of example.

First, a polyimide film is formed on a circuit substrate, and the film is exposed using a mask such that dams having predetermined shapes will be provided in predetermined positions as shown in FIG. 7. Then, the dams are formed using techniques according to the related art, and the substrate is thereafter put in a curing bath to cure the dams.

Then, a chip is flip-chip-connected to the circuit substrate.

Finally, a liquid resin is dispensed to a supplying edge of the circuit substrate to fill a gap between the chip and the circuit substrate with the liquid resin.

A semiconductor device according to the invention can be manufactured through the above-described steps.

As described above, in a semiconductor device according to the invention, a plurality of dams having a predetermined shape is provided in predetermined positions. Thus, a liquid resin can be prevented from flowing out a substrate, and the size of the substrate can therefore be kept small because any unnecessary increase in the substrate size can be avoided by preventing the liquid resin from flowing out.

The embodiments are not to be taken in a limiting sense, and it is obvious that the invention may be carried out in any mode as long as the requirements of the invention are satisfied.

What is claimed is:

1. A semiconductor device comprising:
a substrate having a chip mounting region;
step portions, each including a plurality of side surfaces, formed at peripheries of the chip mounting region and defining a recess that the chip mounting region is disposed within;
a substantially rectangular chip provided on the chip mounting region and having first, second, third and fourth sides defining the rectangular shape of the chip, the first and second sides being directly opposite each other, and the third and fourth sides being directly opposite each other; and
a liquid resin layer disposed between the step portions and the chip,
wherein a first of the step portions is closer to a first side surface of the first side than any other of the step portions,
further wherein one of the side surfaces of the first step portion is substantially parallel to the first side surface,
further wherein second, third and fourth step portions of the step portions are respectively closer to the second, third and fourth sides of the rectangular chip than any other of the step portions,
further wherein the first and second step portions have different shapes from each other and the third and fourth step portions each have a same shape that is different from each of the shapes of the first and second step portions.

2. The semiconductor device according to claim 1, wherein a first portion of the liquid resin layer is disposed between the first side surface and the first step portion, and
further wherein a second portion of the liquid resin layer is disposed between the first step portion and another of the step portions that is disposed closer to the first side than to any of the second, third and fourth sides of the rectangular chip,
further wherein a height of the first portion is greater than that of the second portion.

3. A semiconductor device comprising:
a substrate having a chip mounting region;
step portions, each including a plurality of side surfaces, formed at peripheries of the chip mounting region and defining a recess that the chip mounting region is disposed within;
a substantially rectangular chip provided on the chip mounting region and having first, second, third and fourth sides defining the rectangular shape of the chip, the first and second sides being directly opposite each other, and the third and fourth sides being directly opposite each other; and
a liquid resin layer disposed between the chip and the step portions,
wherein a first of the step portions is closer to a first side surface of the first side than any other of the step portions,
further wherein the first side surface has a first end and a second end opposite the first end, a distance between said first side surface and one of the side surfaces of the first step portion varies between said first end and said second end,
further wherein second, third and fourth step portions of the step portions are respectively closer to the second, third and fourth sides of the rectangular chip than any other of the step portions,
further wherein the first and second step portions have different shapes from each other and the third and fourth step portions each have a same shape that is different from each of the shapes of the first and second step portions.

4. The semiconductor device according to claim 3, wherein from said first end to a point on said first side surface said distance increases, and from said point to said second end said distance decreases.

5. The semiconductor device according to claim 3, wherein said distance is largest at a center of said first side surface.

6. The semiconductor device according to claim 3, wherein from said first end to said second end said distance increases by a consistent amount or decreases by a consistent amount.

7. The semiconductor device according to claim 3, wherein the step portions are each u-shaped.

8. The semiconductor device according to claim 3, wherein the step portions are each arcuate shaped.

9. The semiconductor device according to claim 3, wherein a first portion of the liquid resin layer is disposed between the first side surface and the first step portion, and further wherein a second portion of the liquid resin layer is disposed between the first step portion and another of the step portions that is disposed closer to the first side than to any of the second, third and fourth sides of the rectangular chip,
further wherein a height of the first portion is greater than that of the second portion.

* * * * *